(12) United States Patent
Hauer et al.

(10) Patent No.: US 6,238,508 B1
(45) Date of Patent: May 29, 2001

(54) BONDING METHOD USING FAST HARDENING UV ADHESIVE AND SLOWER HARDENING ADHESIVE

(75) Inventors: Heiner Hauer, Fellbach; Albrecht Kuke, Auenwald; Matthias Mauritz, Backnang, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/420,857

(22) Filed: Oct. 19, 1999

(30) Foreign Application Priority Data

Dec. 7, 1998 (DE) .............................. 198 56 333

(51) Int. Cl.[7] .................................................. B32B 31/28
(52) U.S. Cl. ..................................... 156/273.3; 156/275.3; 156/291; 156/305; 156/330; 257/783; 29/832
(58) Field of Search ............................. 156/273.3, 273.7, 156/275.3, 275.5, 275.7, 290, 291, 305, 330; 257/778, 783; 29/832

(56) References Cited

U.S. PATENT DOCUMENTS 4,954,197 * 9/1990 Jedlicka et al. .................... 156/273.7

FOREIGN PATENT DOCUMENTS

06060346 * 3/1994 (JP) .

* cited by examiner

*Primary Examiner*—Michael W. Ball
*Assistant Examiner*—Michael A. Tolin
(74) *Attorney, Agent, or Firm*—Michael J. Striker

(57) ABSTRACT

In the method of bonding two parts (1,2) together a positioning device (3) accurately positions the two parts (1,2) relative to each other and a comparatively slower hardening adhesive layer (4) is applied between the two parts (1,2) to bond the two parts (1,2) together. After the adhesive layer (4) is applied and the parts positioned, a faster hardening UV adhesive (5) is applied on adjacent edge regions of the two parts (1,2) over an edge of the slower hardening adhesive layer (4), so that the faster hardening UV adhesive (5) is accessible for UV irradiation. Subsequently the faster hardening UV adhesive (5) is hardened with the UV radiation and the positioning device (3) is removed from the parts (1,2) which are held fixed in a provisional manner. Then the slower hardening adhesive layer (4) is hardened preferably in an oven that can be used for a large number of similar pairs of parts.

4 Claims, 1 Drawing Sheet

BONDING METHOD USING FAST HARDENING UV ADHESIVE AND SLOWER HARDENING ADHESIVE

BACKGROUND OF THE INVENTION

1. Field of the Invention

The present invention relates to a method of bonding or of making an adhesive bond, between two parts and, more particularly, to an improved method of bonding of two parts with each other by means of a slower hardening adhesive layer after an adjustment or positioning of the parts has been performed.

2. Prior Art

Adhesive bonding or gluing is used in many areas of engineering, for example, in electronics, electrooptics or micro-optics. Frequently it is necessary to align the parts with high precision in order to obtain a sufficiently high light transmission during coupling between the parts to be bonded together in an optical application or to guarantee reliable electrical contacting in the case of very small electrical contacts in an electronic application. According to the state of the art a number of glues or adhesives are used in this type of adhesive bond. Epoxy-based adhesives provide a particularly high bonding strength. These adhesives can be made electrically conducting by mixing a metallic filling material into them in order to permit a permanent electrical contact. Good heat conduction can be obtained with a ceramic admixture. Hardening for an extended time period at comparatively high temperature is required in order to provide a good bond with these epoxy-based adhesives or glues. A hardening temperature of up to 120° C. for a time period of up to 24 hours is required in order to obtain a satisfactory adhesive force or bonding force. The higher the hardening temperature, the better the adherence. In applications which have stringent or narrow position tolerances, for example in the above-mentioned engineering fields, the relative position of the parts must not be changed during the hardening time after they have been put in the correct positions; in other words, a de-adjustment during hardening must be avoided. Thus the hardening must take place in the adjusting device, which is used for the position alignment or adjustment. This positioning apparatus for the parts is then blocked during the hardening time. In order to obtain a high production throughput either many positioning and gluing devices must be in operation simultaneously which is costly and/or the hardening time must be shortened using a high hardening temperature. However in many applications the hardening temperature is limited by the installation or operation temperature range of the parts to be glued together.

According to the state of the art in order to avoid the above-described disadvantages for a production process for larger numbers of parts, adhesives or glues are used which are transparent and hardened by ultraviolet radiation. These so-called UV adhesives are irradiated with UV light for a few seconds up to a maximum of 10 minutes. They have a comparatively short hardening time in comparison to epoxy-based adhesives. However the entire volume of the UV adhesive must be irradiated with the UV light in order to obtain a complete hardening of the adhesive. Thus at least one of the parts to be bonded must be transparent to UV light in order to obtain an adherent gluing of the two parts. Otherwise only one glue seam or bond in a freely accessible edge region of the parts to be bonded is possible. Thus the range of applications for this method of UV bonding is considerably narrowed or limited. The substantially weaker adherence of the UV bonding compound and its lower glass transition temperature, which limits the temperature operation range, are additional disadvantages for the UV bonding method.

SUMMARY OF THE INVENTION

It is an object of the present invention to provide a method of bonding two parts together of the above-described type, which does not have the disadvantages described above.

This object, and others which will be made more apparent hereinafter, are attained in a method of bonding of two parts with each other with a slower hardening adhesive layer after a prior adjustment of the parts.

According to the invention the method of bonding two parts together comprises the steps of:

a) providing a positioning device for positioning the two parts relative to each other;

b) applying a comparatively slower hardening adhesive layer to the two parts and adjusting the position of the two parts with respect to each other with the positioning device;

c) after the applying and adjusting of step b), applying a faster hardening UV adhesive in an edge of the slower hardening adhesive layer, so that the faster hardening UV adhesive is accessible for UV irradiation;

d) subsequently hardening the faster hardening UV adhesive with UV radiation;

e) removing the positioning device; and subsequently f) hardening the slower hardening adhesive layer.

The method according to the invention combines the advantages of the above-described prior art bonding methods while eliminating the stated disadvantages. An adjustment device required for positioning is only required for a comparatively shorter time (than in the case of a purely epoxy prior art bonding method) and a comparatively higher adherence is obtained (than in the case of purely UV bonding method).

Advantageous further features are claimed in the appended dependent claims and are described hereinbelow.

In a particularly preferred embodiment of the invention the comparatively slower hardening adhesive layer is an epoxy-based adhesive or an epoxy resin adhesive or glue. Advantageously the hardening of the comparatively long-hardeing adhesive layer takes place in an oven. In a preferred production method according to the invention a plurality of pairs of parts are simultaneously hardened in the oven in order to harden the slower hardening adhesive layer.

The term "slower hardening" means slower in comparison to the longer hardening time of the faster hardening UV adhesive. Correspondingly the term "faster hardening" means faster than the slower hardening adhesive layer.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

Figure 1:
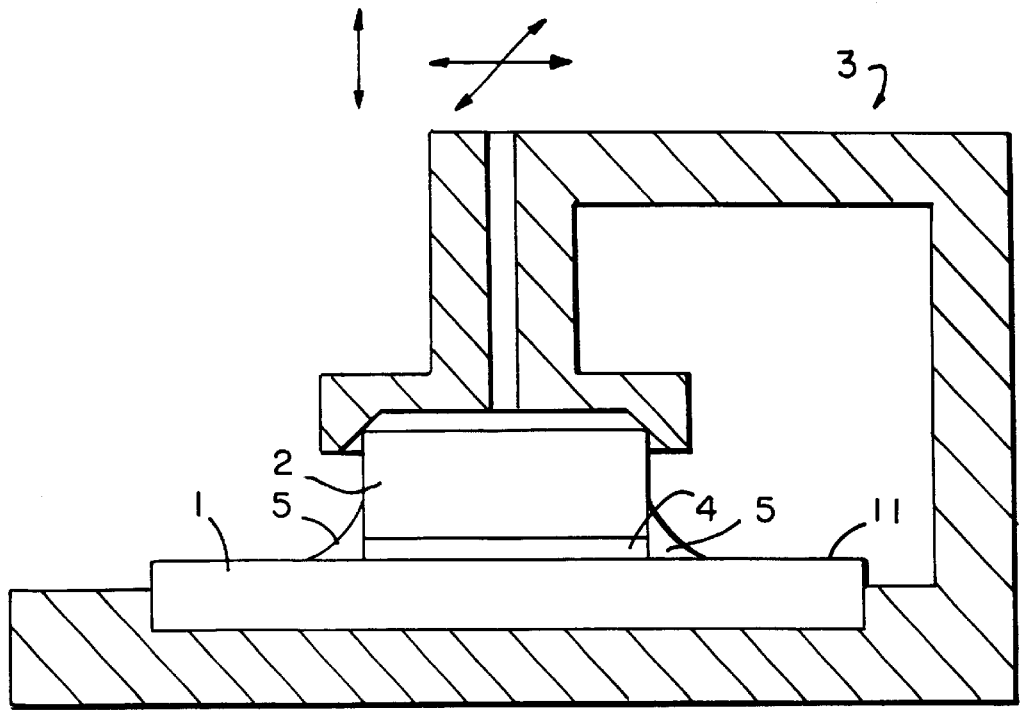
FIG. 1 is a diagrammatic cross-sectional view of two highly accurately positioned parts bonded with each other using the method according to the invention.
Figure 2:
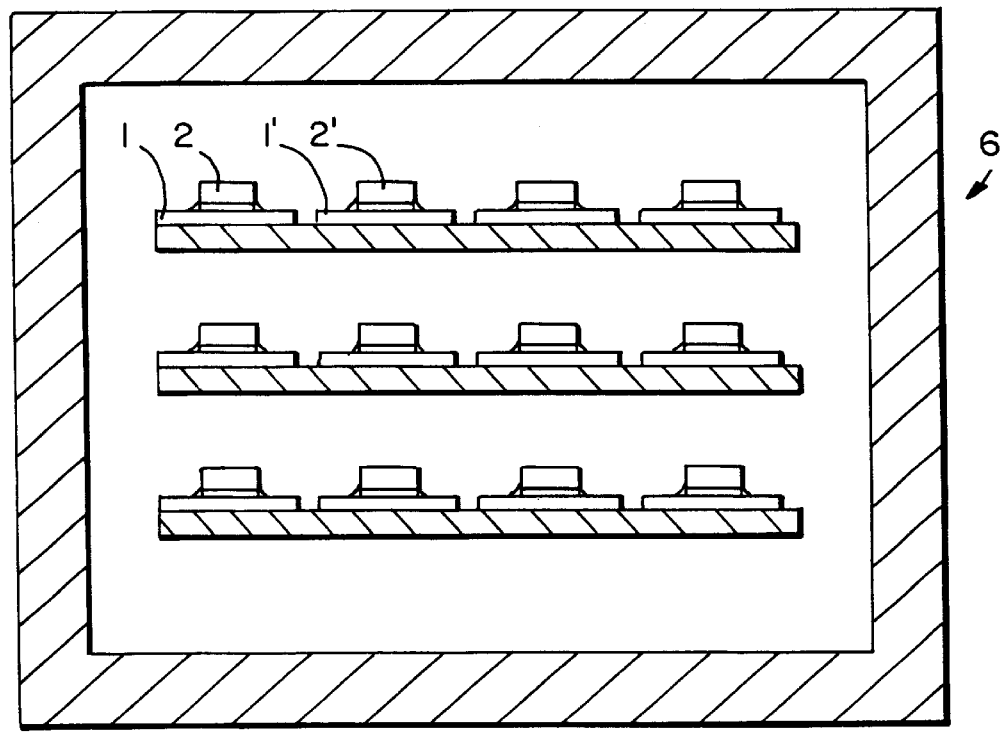
FIG. 2 is a diagrammatic cross-sectional view of an oven in which pairs of parts are heated in an adhesive layer hardening step of the method according to the invention.

FIG. 1 shows two parts 1,2 bonded together in one embodiment of the method according to the invention, which are adjusted or positioned with a comparatively high precision. For example, one part 1 or a first part 1 can be a substrate, while another part 2 or a second part 2 can be a component to be mounted on the substrate. Both parts 1,2 can be positioned with a high precision with the adjusting or positioning device 3 shown in FIG. 1. An adhesive layer 4 of epoxy resin is applied between the upper surface or side 11 of the substrate 1 and the lower side or surface of the component 2 in the region where the opposing surfaces overlap. A UV adhesive 5 is applied over an exposed edge 4 of the adhesive layer 4 in an edge region of one of the parts 1 or 2 so that it wets an adjacent edge region of the part 2 (which is connected to the region of the opposing overlapping surfaces) and in this embodiment a portion of the upper surface or sided 11 of the substrate 1. The UV adhesive 5 is located so that it can be illuminated with UV light from at least one side. After adjustment, the UV adhesive 5 is illuminated with UV light and as a result a preliminary fixing of the two parts 1,2 in position with respect to each other is achieved. This preliminary fixing is stable enough to that the provisionally bonded parts 1 and 2 may be removed from the adjusting or positioning device 3 and placed in an oven 6 (FIG. 2). After a short hardening time for the UV adhesive the adjusting or positioning device 3 is then prepared to receive the next pair of parts 1',2' which are subsequently treated like the first pair of parts 1,2. The slower hardening adhesive layer 4 of epoxy resin between the first pair of parts 1,2 can be hardened at the same time as the adjusting device is prepared for the next pair of parts 1',2' The oven 6 of course can simultaneously harden the adhesive layer 4 in a large number of such pairs. The production process based on the method according to the invention is substantially shorter than the corresponding prior art process.

The parts 1 and 2 however must not be greatly different in size from each other in order to bond them with the method according to the claimed invention. However two large parts can be glued with each other using the method according to the invention.

The disclosure in German Patent Application 198 56 333.7 of Dec. 7, 1998 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in an improved bonding method for bonding two parts, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method of bonding two parts together comprises the steps of:

a) providing a positioning device (3) for positioning the two parts (1,2) relative to each other;

b) applying a first adhesive layer (4) comprising a first adhesive to the two parts (1,2) to bond the two parts (1,2) together and adjusting the position of the two parts with respect to each other with the positioning device (3);

c) after applying the first adhesive layer (4) and after the adjusting of step b), applying a second adhesive which is UV hardenable (5) on the two parts (1,2) and over an edge of the first adhesive layer (4), so that the second adhesive (5) is accessible for UV irradiation, wherein the second adhesive hardens faster than the first adhesive;

d) subsequently hardening the second adhesive (5) with UV radiation;

e) removing the positioning device (3); and subsequently f) hardening the first adhesive layer (4).

2. The method as defined in claim 1, wherein the first adhesive comprises an epoxy resin.

3. The method as defined in claim 1 or 2, wherein the hardening of the first adhesive layer (4) takes place in an oven (6).

4. The method as defined in claim 3, further comprising placing a plurality of pairs of said parts (1,1',2,2'), each pair formed by steps a) through e) of claim 1, in said oven to harden the first adhesive layer of each pair.

* * * * *